United States Patent [19]

Long et al.

[11] Patent Number: 4,836,371

[45] Date of Patent: Jun. 6, 1989

[54] FILLER STRIPS

[75] Inventors: Kenneth J. Long, Hutto; Bobby W. Formby, Round Rock, both of Tex.

[73] Assignee: Motorola, Inc., Schaumburg, Ill.

[21] Appl. No.: 109,564

[22] Filed: Oct. 19, 1987

[51] Int. Cl.$^4$ ............................................. B65D 73/02
[52] U.S. Cl. .................................. 206/334; 206/328; 206/814
[58] Field of Search ............... 206/328, 330, 334, 814, 206/526; 220/DIG. 19; 361/212, 220

[56] References Cited

U.S. PATENT DOCUMENTS

| | | | |
|---|---|---|---|
| 4,037,267 | 7/1977 | Kisor | 361/220 |
| 4,120,443 | 10/1978 | Gardner et al. | 206/521 |
| 4,148,396 | 4/1979 | Gardner | 206/424 |
| 4,327,832 | 5/1982 | de Matteo | 206/328 |
| 4,485,531 | 12/1984 | Murphy | 206/328 |
| 4,515,269 | 5/1985 | Hashimoto | 206/334 |
| 4,552,267 | 11/1985 | Layher | 206/334 |
| 4,564,880 | 1/1986 | Christ et al. | 361/212 |
| 4,565,288 | 1/1986 | Walther | 206/328 |
| 4,592,481 | 6/1986 | Chen | 206/334 |
| 4,635,794 | 1/1987 | Lemmer | 206/328 |
| 4,655,364 | 4/1987 | Swapp et al. | 206/334 |
| 4,685,562 | 8/1987 | Swain | 206/334 |
| 4,690,274 | 9/1987 | Lue | 206/328 |
| 4,721,206 | 1/1988 | Votter | 206/334 |

FOREIGN PATENT DOCUMENTS 38179 10/1981 European Pat. Off. ............ 206/328

OTHER PUBLICATIONS

W. R. Wanesky, Package for Transporting Beam-Lead Devices on a Substrate, Western Electric, 7/69.
Wanesky et al., Integrated Circuit Shipping Package, Apr. 1973.
Hershoff, Wafer Package IBM Technical Disclosure Bulletin, 4/66.

Primary Examiner—David T. Fidei
Attorney, Agent, or Firm—John A. Fisher

[57] ABSTRACT

A filler strip for temporarily securing or clinching longitudinally arrangeable individual components in a tube, rod or hollow magazine. The filler strip is generally flat, but has surface features that serve to press the component against the top, bottom or side of the tube to prevent the component from knocking against adjacent components and cracking, chipping or otherwise damaging one or more of the components. The filler strip is particularly suited to eliminating the knocking motion of expensive ceramic integrated circuit packages that are shipped and handled in transparent plastic tubes or rails.

15 Claims, 2 Drawing Sheets

FILLER STRIPS

FIELD OF THE INVENTION

The invention relates to structures and methods for containing pluralities of parts or component, and more particularly relates to structures and methods for temporarily securing a plurality of components in a tube or hollow rod.

BACKGROUND OF THE INVENTION

Integrated circuits or ICs, as they are sometimes called, are assembled into a variety of package types. Some of the more common include dual in-line packages (DIPs), quad-packs, plastic leaded chip carriers (PLCCs) and pin grid arrays (PGAs). Typically, all of these packages are stored and transported in some form of tube, rod or rail magazine. The tubes are, for example, approximately 50 cm long, and are made of transparent, antistatic synthetic material, such as a resilient plastic. The interior cross-section of the tube is usually somewhat adapted to the cross-section of the package that is to contain. For example, when DIPs are stored, the tube has a chamber with a substantially U-shaped profile, see, for example, FIG. 1. The IC packages lie in tandem between the concave wall that is protruding inward toward the center of the tube and the wall of the tube opposite the protrusion. The connecting legs or leads of the DIPs project into those areas of the chamber which form the sides of the U-shaped profile of the chamber.

It is conventional to use rubber stoppers or sealing pins extending transversely through the tube chamber to seal the rods or magazines. If one or several packages are to be taken out of the tube, the rubber stopper or the sealing pin must be removed at one end of the tube and the tube must then be tilted so that the desired number of ICs slide out. The open end of the rod-magazine is then kept shut with one finger and the rubber stopper or sealing pin is inserted again. This method is particularly troublesome and difficult if the rod or tube is, for example, to be placed upon a device handler or tester or a printed circuit board assembly apparatus that will use the packages on an assembly table for putting together printed circuit boards. In these cases, the tube must then be kept closed with a finger until immediately before insertion into the handler. Shortly before insertion, however, the finger performing the closing action must then be taken away from the opening due to lack of space, and as a result, there is a danger that the IC packages will unintentionally slide out of the tube prematurely.

Generally, these conventional tubes or rails have a cross-section or profile that prevents the components from rotating in the tube, but at the same time permitting them to slide longitudinally for feeding into the device handlers. It can be appreciated that devices with similar cross sections, that would fit in a particular type of shipping tube or rail, may be of different lengths. And since the tubes are of a standard size and have approximately the same lengths, when the devices are loaded into the standard sized tubes, there can be considerable distance between the parts, and between the parts and the end securing means. This is particularly true when the tube does not contain the maximum number of that size of part.

It will further be appreciated that during the handling and shipping of tubes or rails containing the IC parts that the parts will knock against each other. Such knocking or sharp contacts between the parts due to the motions of shipping and handling will occasionally cause the bodies of the packages to chip or crack, sometimes damaging the device so much that it cannot be used. This problem is particularly acute with ceramic packages, since the ceramic package bodies are considerably more brittle than the plastic bodiess. Further, both the ceramic bodies and the integrated circuits inside are more expensive than their plastic counterparts, thus, the problem of package knocking can be costly.

A number of schemes have been devised to modify both the packages and the tubes to address this problem. For example, various bumber structure have been added to the ends of the packages that contact each other. Alternatively, the rails have been modified to more securely hold the package. These solutions tend to make the packages or the tubes or both more expensive. Further, the industry has widely accepted the conventional tubes or rails, and considerable equipment is presently being used that accepts the conventional rails. Thus, for a new rail or tube design to be accepted by the industry, it must be compatible with the existing handling equipment.

SUMMARY OF THE INVENTION

Accordingly, it is an object of the present invention to provide a structure for temporarily securing or clinching a plurality of individual components, such as packaged integrated circuits, in a longitudinal tube or rail to prevent them from impacting each other during handling or shipping.

Another object of the present invention is to provide a structure for temporarily securing a plurality of components within a conventional hollow rod or magazine that is inexpensive and does not alter the rod or magazine, thereby permitting it to be loaded or unloaded in a conventional manner.

Still another object of the invention is to provide a structure for temporarily clinching a plurality of components in a longitudinal package like a tube that does not depend on the length of the components, or the number of them in the tube.

A further object of the invention is to provide a structure for temporarily securing a plurality of components within a tube, but which structure can be unloaded easily to release the components.

In carrying out these and other objects of the invention, there is provided, in one form, a removable filler strip for securing a plurality of individual components in a tube that has a flat, elongated body and at least one surface feature of sufficient size to temporarily clinch the components against the tube.

DETAILED DESCRIPTION OF THE INVENTION

Figure 1:
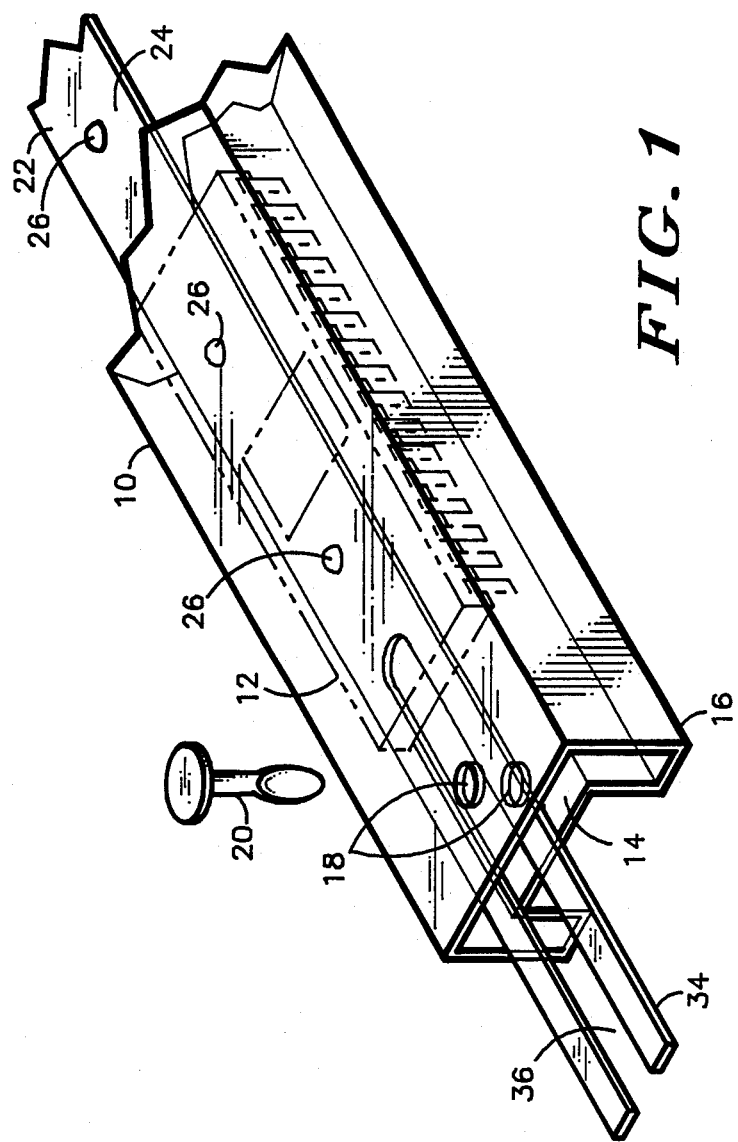
FIG. 1 is a partial isometric view of an end of a conventional rail or tube that has the filler strip of the present invention deployed therein to clinch the IC package to the wall of the tube.

Shown in FIG. 1 is one end 16 of a conventional shipping tube or rail 10. Since tube 10 is for DIP IC packages, such as the one shown at 12, it has a cavity 14 with a U-shaped cross-section that fits the contour of the cross-section of the package 10. Tube 10 conventionally has two ends 16 that have a structure for closing the end of the hollow tube 10 to keep the packages 12 from sliding out. In the particular embodiment shown in FIG. 1, the securing or end plugging structure is a set of holes 18 transverse through the tube so that a securing pin 20 may pierce the holes and block the ends 16. Any of the conventional tube end 16 plugging structures, such as foam plugs or wire retainers, are expected to be compatible with the present invention.

Also shown in FIG. 1 is the filter strip 22 of the present invention, the strip 22 including a flat, elongated body 24 and at least one surface feature 26. In the embodiment shown in FIG. 1, the surface features 26 are dimples or protrusions that push up the surface of the flat body. The strip 22 is made out of any semi-rigid or resilient material, such as a thermoset, thermoplastic or other plastic material.

Figure 2:
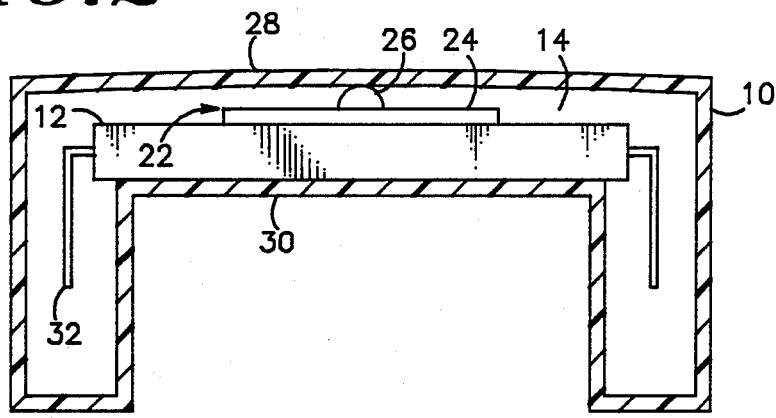
FIG. 2 is a sectional view of a conventional shipping rail or tube for DIP IC packages illustrating the detail how the package is held in place by the filler strip.

The operation of the filler strip 22 is shown in more detail in FIG. 2 where the filler strip 22 is positioned between the DIP 12 and the top wall 28 of the tube 10. It is apparent that dimple 26 presses against the top wall 28, slightly deforming it, and thus causes sufficient pressure against the DIP 12, which is, in turn, applied against the bottom wall 30 of tube 10 to clinch or secure the DIP 12 and prevent it from moving relative to the tube 10. Feature 26 must be designed to be large enough to fully occupy the expected distance in the cavity 14 between the package 12 and the walls 28 and 30, and then a little beyond that distance so that an appropriate holding pressure will be created, but not so large that there will be undue difficulty in inserting the filler strip 22 into the rail 10 with the packages 12. If the tube or rail 10 is more rigid, such as a metal rail, then the surface feature may have to be modified to be resilient and deformable itself, rather than relying upon the rail surfaces to flex or deform.

There is no limitation on how the strip 22 should be oriented; it may be oriented upside down from that depicted in FIG. 2, or it may be positioned under the DIP package 12 shown. Applying the strip 22 against the leads 32 of the package 12 would not be beneficial as the leads 32 may be bent. Certainly the strip 22 may be designed to be applied to other parts, objects or structures than electronic components which are packaged in tubes, rods, or rails, that is, stacked longitudinally or adjacent each other.

Also shown in FIG. 1 is another feature of the filler strip 22, namely the end 34, which may extend beyond the end 16 of the tube 10 so that the filler strip 22 may be grasped and pulled out of the tube 10 to release one, many or all of the devices 12. While it may take a specialized apparatus to insert the strip 22 into the tube 10 along with the components 12; if designed properly, the filler strip 22 may be withdrawn by hand. Although the strips 22 could be saved and reused, it is anticipated that in practice the strips will be discarded, or other materials recycled. Typically, the manufacturer of the component or DIPs 12 will ship the tubes 10 with the filler strip 22 in place, and the customer will remove the strip 22 by hand or by machine just before the components are to be used, discarding the strip.

In the end 34 of the filler strip 22 is a securing structure passage 36. The passage 36 simply makes way for or provides clearance for whatever tube 10 end 16 securing structure that is employed. In the particular embodiment illustrated, a securing pin 20 is used, thus, the securing structure passage 36 has a longitudinal slot shape to accommodate the presence of the pin 20. In an actual use of the filler strip in an application depicted in FIGS. 1 and 2, the securing pins 20 were used as a safety measure only, for when the filler strip 12 was in place, the parts 12 could not be shaken out of the tube 10 by hand. Passage 36 could take the form of a slot-shaped hole, as shown in the alternate embodiment depicted in FIG. 4.

Figure 3:
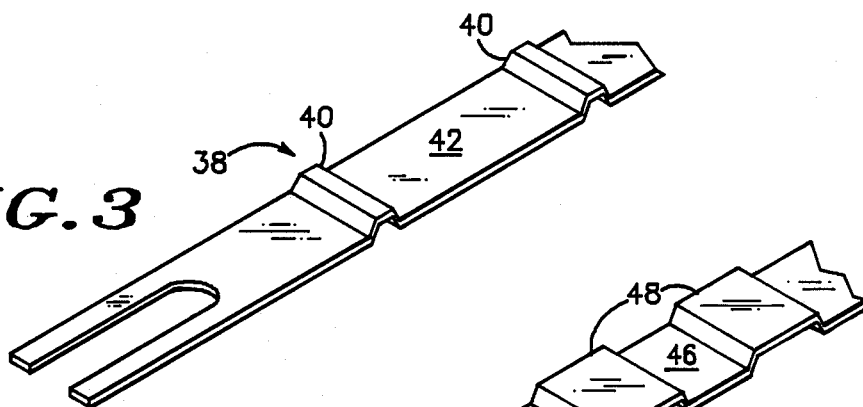
FIGS. 3 through 5 are partial isometric views of alternate embodiments of the filler strip of the invention employed different kinds of surface features.

FIG. 3 shows an alternate embodiment of the filler strip 38 where the surface features 40 are transverse wrinkles or bumps in the flat, elongated body 42 of the strip 38. These wrinkles 40 will perform the same temporary holding function as the dimples 26.

Both the dimples 26 and the wrinkles 40 may be spaced either periodically or randomly. However, the surface features should be spaced close enough together so that at least one feature occurs adjacent every component, accounting for the smallest component. Care should be taken to insure that the surface features are not so large and precisely matched to the package size that they come between the packages, which would reduce their effectiveness.

It is apparent from the example shown in FIG. 1, that there exist a number of DIP packages 12 of different lengths that would have a cross-section enabling them to be stacked in tube 10. Thus, the minimum spacing of the surface features 26 should be equal to or less than the length of the shortest DIP package 12.

It can be further appreciated that the filler strip 22 and the tube 10 is an assembly that must be designed for components with a particular cross section, although as noted, the length of the component may vary. However, it can also be appreciated that the filler strip can be of a standard length and width, as long as it is narrower than the narrowest tube it is expected to be used in and as long as the longest tube it is expected to be used in.

Figure 4:
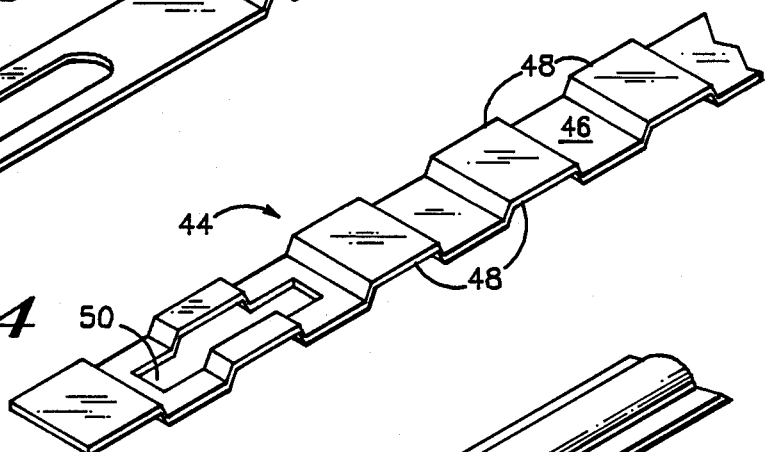

FIG. 4 shows another embodiment of the strip 44 where the relatively flat, elongated body 46 and the surface features, the corrugations 48 are essentially one and the same. Note that the securing structure passage 50 is an enclosed slot. Both the slot 50 and the corrugations 48 may assist in the removal of the strip 44 from the tube 10.

Figure 5:
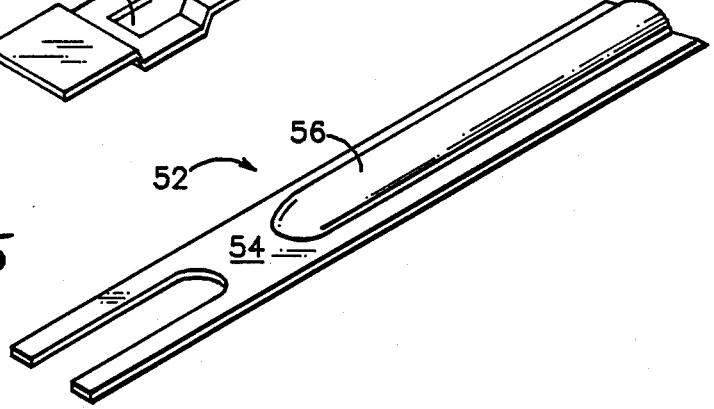

FIG. 5 depicts a further embodiment of the invention, and shows a filler strip 52 having a flat, elongated body 54 and a surface feature 56. In this embodiment, the surface feature 56 is a shallow, longitudinal bulge that demonstrates that a single feature can serve as the structure for temporarily clinching all of the components 12 in a tube 10.

It will be appreciated that the filler strip can be used with conventional tubes to be compatible with existing handling equipment. Indeed, it is apparent that the end securing means of the tube may be released and the tube placed in the handler before the filler strip is removed, thereby insuring against the premature release of components from the tube. Additionally, the filler strips are inexpensive, easy to use and disposable. Most importantly, however, the strips perform the function of temporarily securing or clinching the components in the tube to prevent damage during handling. In the case of ceramic IC packages, after the implementation of the filler strip no packages were found damaged after shipping.

I claim:

1. A removable filler strip for securing a plurality of individual components in a tube having at least first and second walls, comprising a flat, elongated, resilient body sufficiently thin to fit between the components and the first wall and having at least one surface feature of sufficient size to temporarily clinch the components against the second wall.

2. The removable filler strip of claim 1 wherein the body is of sufficient length to extend beyond the tube to permit the strip to be held and removed from either end of the tube.

3. The removable filler strip of claim 1 further comprising two ends and a securing pin passage in at least one of the ends.

4. The removable filler strip of claim 1 wherein the surface feature comprises a plurality of features positioned along the length of the strip.

5. The removable filler strip of claim 1 wherein the surface feature comprises a plurality of raised dimples.

6. The removable filler strip of claim 1 wherein the surface feature comprises a corrugated texture.

7. The removable filler strip of claim 1 wherein the surface feature comprises a plurality of bends positioned transverse to the length of the strip.

8. The removable filler strip of claim 1 wherein the surface feature comprises at least one longitudinal bulge parallel to the length of the strip.

9. A filler strip and packing tube assembly for temporarily securing a plurality of individual components in a tube, comprising:
a hollow, elongated, tube having at least first and second walls adapted to longitudinally contain the plurality of individual components; and
a removable filler strip comprising
a flat, elongated, resilient body sufficiently thin to fit between the components and the first wall; and
at least one surface feature of sufficient size to temporarily clinch the components against the second wall.

10. The filler strip and packing tube assembly of claim 9 wherein the body of the strip is of sufficient length to extend beyond the tube to permit the strip to be held and removed from either end of the tube while the components remain in the tube.

11. The filler strip and packing tube assembly of claim 9 wherein the strip further comprises two ends and a securing pin passage in at least one of the ends.

12. The filler strip and packing tube assembly of claim 9 wherein the surface feature of the filler strip comprises a plurality of features positioned along the length of the strip.

13. A filler strip and packing tube assembly for temporarily securing a plurality of individual electronic components in a tube, comprising:
a hollow, elongated tube having
at least first and second walls; and two open ends, the tube to longitudinally contain the plurality of individual components, wherein the ends have means for closing the end for securing the components within the tube; and
a removable filler strip comprising
a flat, elongated, resilient body sufficiently thin to fit between the components and the first wall;
at least one surface feature of sufficient thickness to temporarily clinch the components against the second wall; and
two ends, each having a passage providing clearance for the tube closure means.

14. The filler strip and packing tube assembly of claim 13 wherein the body of the strip is of sufficient length to extend beyond the tube to permit the strip to be held and removed from either end of the tube while the component remain in the tube.

15. The filler strip and packing tube assembly of claim 13 wherein the surface feature of the filler strip comprises a plurality of features positioned along the length of the strip.

* * * * *